(12) United States Patent
Szafraniec

(10) Patent No.: US 9,817,046 B2
(45) Date of Patent: Nov. 14, 2017

(54) SYSTEM AND METHOD FOR MEASUREMENT OF S-PARAMETERS AND DISPERSION AND PROVIDING A BLENDED SOLUTION OF BOTH

(71) Applicant: Keysight Technologies, Inc., Minneapolis, MN (US)

(72) Inventor: Bogdan Szafraniec, Sunnyvale, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 257 days.

(21) Appl. No.: 14/822,239

(22) Filed: Aug. 10, 2015

(65) Prior Publication Data

US 2016/0103166 A1 Apr. 14, 2016

Related U.S. Application Data

(60) Provisional application No. 62/062,123, filed on Oct. 9, 2014.

(51) Int. Cl.
*G01R 27/28* (2006.01)
*G01R 29/00* (2006.01)

(52) U.S. Cl.
CPC .................... *G01R 27/28* (2013.01)

(58) Field of Classification Search
CPC combination set(s) only.
See application file for complete search history.

(56) References Cited

U.S. PATENT DOCUMENTS

| 4,977,376 A | * | 12/1990 | Schiek | .......... | G01R 29/00 |
| | | | | | 324/605 |
| 2007/0146721 A1 | | 6/2007 | Barcelos et al. | | |
| 2013/0317767 A1 | * | 11/2013 | Mori | .......... | G01R 27/28 |
| | | | | | 702/57 |

FOREIGN PATENT DOCUMENTS

| DE | 102008027033 B4 | 7/2010 |
| WO | 2009/127843 A1 | 10/2009 |

OTHER PUBLICATIONS

English Translation of DE102008027033.

* cited by examiner

*Primary Examiner* — Vincent Q Nguyen

(57) ABSTRACT

A system includes a test signal generator generating a test signal having a carrier and at least two sidebands, and provides the test signal to a device under test (DUT). A plurality of couplers sense an incident signal, a reflected signal, and a transmitted signal for the DUT at corresponding test ports of the test system when the test signal is supplied to the DUT. A signal processing apparatus: detects S-parameters for the DUT from the carrier present in each of the incident signal, reflected signal, and transmitted signal for the device under test; measures a dispersion for the DUT at each of the test ports from the two sidebands present in the incident signal, reflected signal, and transmitted signal for the device under test using the two frequencies; and combines the detected S-parameters and the measured dispersions to output enhanced measurements of the S-parameters and the dispersions.

26 Claims, 12 Drawing Sheets

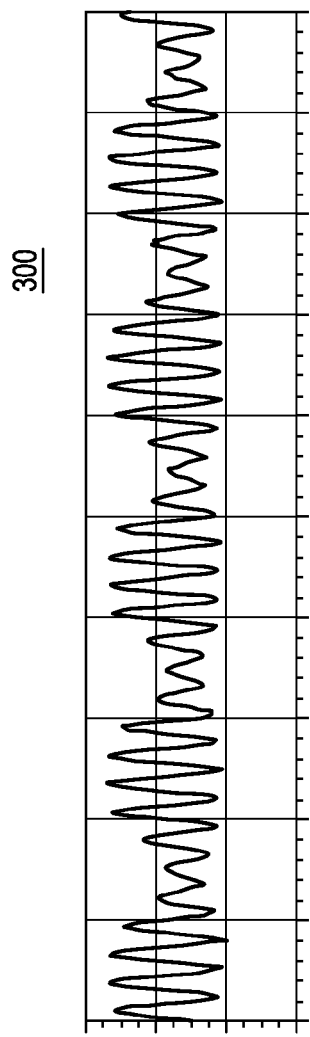
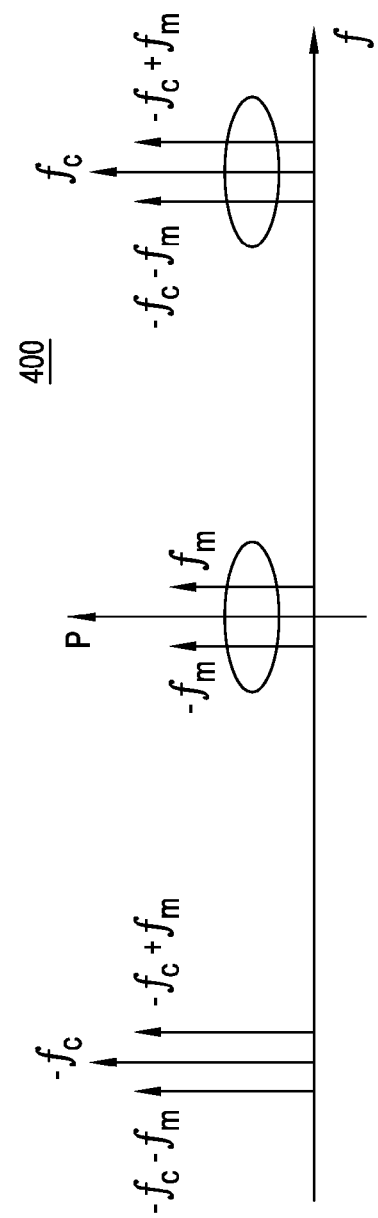
FIG.3
FIG.4

PORT B PHASOR  = S$_{21}$ · PORT A PHASOR

SYSTEM AND METHOD FOR MEASUREMENT OF S-PARAMETERS AND DISPERSION AND PROVIDING A BLENDED SOLUTION OF BOTH

CROSS-REFERENCE TO RELATED APPLICATIONS

This patent application claims priority under 35 U.S.C. §119(e) from commonly-owned U.S. Provisional Application 62/062,123, filed on 9 Oct. 2014 in the name of Bogdan Szafraniec. The entire disclosure of U.S. Provisional Application No. 62/062,123 is specifically incorporated herein by reference.

BACKGROUND

A commonly accepted method of characterizing electrical networks is a measurement of so called scattering parameters, also known as S-parameters. S-parameters describe electrical waves that are reflected from or transmitted through the device under test (DUT).

While the method's success and usefulness is unprecedented and unquestionable, its implementation becomes increasingly more difficult as the frequency coverage of modern network analyzers increases and the test is performed in harsher and harsher environments. For example, in the case of measuring S-parameters at optical frequencies, the laser phase noise makes a direct measurement of phase very difficult if not impossible. In addition, the DUT itself may be a spool of fiber that is 100 km long and very sensitive to environmental changes, therefore corrupting the phase of even the most stable laser sources.

Thus it would be desirable to provide a more convenient and more reliable method and system to measure and characterize an electrical system or network.

SUMMARY

In an example embodiment, a system comprises: a test signal generator configured to generate a test signal having a carrier and at least two sideband frequencies and to provide the test signal to a device under test; a plurality of couplers for sensing an incident signal, a reflected signal, and a transmitted signal for the device under test at corresponding test ports of the system when the test signal is supplied to the device under test; a signal processing apparatus configured: to detect S-parameters for the device under test from a carrier present in each of the incident signal, reflected signal, and transmitted signal for the device under test; to measure a dispersion for the device under test at each of the test ports from the two sideband frequencies present in the incident signal, reflected signal, and transmitted signal for the device under test; and to combine the detected S-parameters and the measured dispersions to output enhanced measurements of the S-parameters and the dispersions.

In another example embodiment, a method comprises: generating with a test signal generator a test signal having a carrier and at least two sideband frequencies; providing the test signal to a device under test; sensing an incident signal, a reflected signal, and a transmitted signal for the device under test at corresponding test ports of a test system when the test signal is supplied to the device under test; detecting S-parameters for the device under test from the carrier present in each of the incident signal, reflected signal, and transmitted signal for the device under test; measuring a dispersion for the device under test at each of the test ports of the test system from the two sideband frequencies present in the incident signal, reflected signal, and transmitted signal for the device under test; and combining the detected S-parameters and the measured dispersions to output enhanced measurements of the S-parameters and the dispersions.

In yet another example embodiment, an apparatus comprises: a first optical source configured to output a first optical signal having a first frequency, wherein the first optical source is further configured for modulating the first optical signal; a second optical source configured to output a second optical signal having a second frequency different from the first frequency; an optical combiner configured to combine the modulated first optical signal and the second optical signal; and a square law detection device configured to receive the combined modulated first optical signal and second optical signal and in response thereto to produce an electrical signal which includes a carrier as a beat frequency between the first frequency and the second frequency, and which further includes at least two sideband frequencies generated in response to the modulating of the first optical signal.

In still another example embodiment, a method of generating a test signal comprises: outputting a first optical signal having a first frequency; modulating the first optical signal to produce a modulated first optical signal; outputting a second optical signal having a second frequency different from the first frequency; combining the modulated first optical signal and the second optical signal; and detecting the combined modulated first optical signal and second optical signal with a square law detector to produce the test signal which includes a carrier as a beat frequency between the first frequency and the second frequency and which further includes the at least two sidebands having corresponding sideband frequencies generated in response to modulating the first optical signal.

BRIEF DESCRIPTION OF THE DRAWINGS

The example embodiments are best understood from the following detailed description when read with the accompanying drawing figures. In fact, the dimensions may be arbitrarily increased or decreased for clarity of discussion. Wherever applicable and practical, like reference numerals refer to like elements.

FIG. 3 illustrates the time waveform of an example signal which may be generated by the example embodiment of a signal generator of FIG. 2.

FIG. 4 illustrates the frequency spectrum of an example signal which may be generated by the example embodiment of a signal generator of FIG. 2.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

Figure 1:
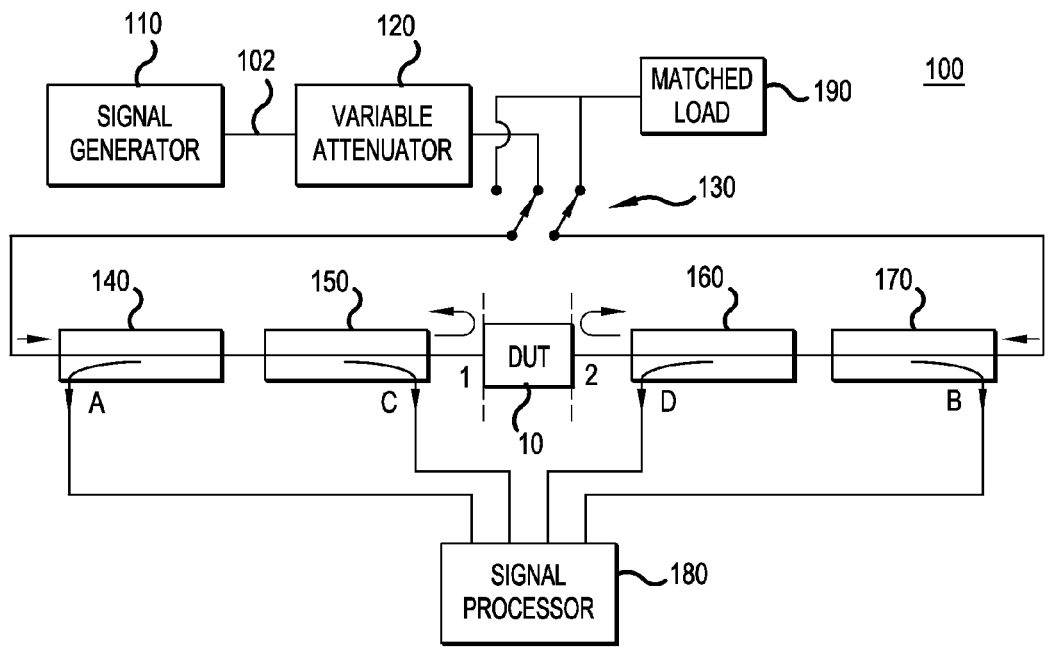
FIG. 1 illustrates an example embodiment of a system for characterizing a device under test (DUT).

FIG. 1 illustrates an example embodiment of a system 100 for characterizing a device under test (DUT) 10. System 100 includes: a test signal generator 110, variable attenuator 120, a switch 130, a plurality of couplers 140, 150, 160 and 170, a signal processor 180, and a matched load 190. Couplers 140, 150, 160 and 170 may each be a directional coupler.

System 100 is an example of a generic two-port system for testing a two port DUT 10, but principles described below may in general be applied to systems which test devices with more than two ports. Furthermore, system 100 includes four test ports, labeled A, B, C and D, and is an example of a system where both ports of DUT 10, labeled 1 and 2 in FIG. 1, may be characterized, leading to characterization of a total of four (4) scattering parameters or S-parameters for DUT 10, generally referred to as S11, S12, S22, and S21 as is known in the art. However, in other examples only some of the S-parameters for DUT 10 may be characterized. For example, in one embodiment: switch 130 and couplers 160 and 170 may be eliminated, and the output of variable attenuator 120 may be provided directly to coupler 140, and the output of from port 2 of DUT 10 may be connected directly to the input of signal processor 180 as test port D, in which case only the S11 and S21 S-parameters may be measured. Many other variations are possible.

In operation, when switch 130 is in a first position, which is illustrated in FIG. 1, a test signal 102 output by signal generator 110 is connected via variable attenuator 120 to port 1 of DUT 10, and port 2 of DUT 10 is connected to matched load 190. In that case: coupler 140 provides a fraction of the incident wave at test system port A; coupler 150 provides a fraction of the wave that is reflected from port 1 (e.g., an input port) of DUT 10 at test system port C; and coupler 160 provides a fraction of the wave which is transmitted through DUT 10 from port 1 to port 2 at test system port D. Through the sensed incident signal, the sensed reflected signal, and the sensed transmitted signal for DUT 10 with switch 130 in the first position, signal processor 180 may determine S11 and S21 for DUT 10, as well as dispersion parameters for ports 1 and 2 and dispersion of S11 and S21.

When switch 130 is in its second position, then the output of signal generator 110 is connected via variable attenuator 120 to port 2 of DUT 10, and port 1 of DUT 10 is connected to matched load 190. In that case: coupler 170 provides a fraction of the incident wave at test system port B; coupler 160 provides a fraction of the wave that is reflected from port 2 (e.g., an output port) of DUT 10 at test system port D; and coupler 150 provides a fraction of the wave which is transmitted through DUT 10 from port 2 to port 1 at test system port C. Through the sensed incident signal, the sensed reflected signal, and the sensed transmitted signal for DUT with switch 130 in the second position, signal processor 180 may determine S12 and S22 for DUT 10, as well as dispersion parameters for ports 1 and 2 and dispersion of S12 and S22.

An explanation will now be provided of a construction and method of operation of system 100 which may provide enhanced or more accurate measurements of the S-parameters and the dispersions of DUT 10 by combining or blending the separate measurements of the S-parameters and the dispersions.

In particular, described below are embodiments of a method and system for direct measurement of S-parameters and dispersion that in addition may blend S-parameters and dispersion to produce an enhanced estimate of both. The present inventor has appreciated that a relationship exists between S-parameters and dispersion which can be exploited to enhance the accuracy of the measurements of both. In particular, dispersion is a derivative of an argument of the exponential function when S-parameter is written in an exponential form as explored in greater detail below. When a direct measurement of S-parameter is difficult or simply not available, dispersion can be used to aid the process of estimating the S-parameters. The opposite scenario is also possible. When measurements of S-parameters are precise, they can be used to enhance direct measurements of dispersion. In some embodiments, the blending process may take place by means of a Kalman filter. Accordingly, systems and methods described below simultaneously measure both S-parameters and dispersion, and exploit recursive relationships between them to allow use of techniques such as Kalman filtering to arrive with a blended solution.

Figure 2:
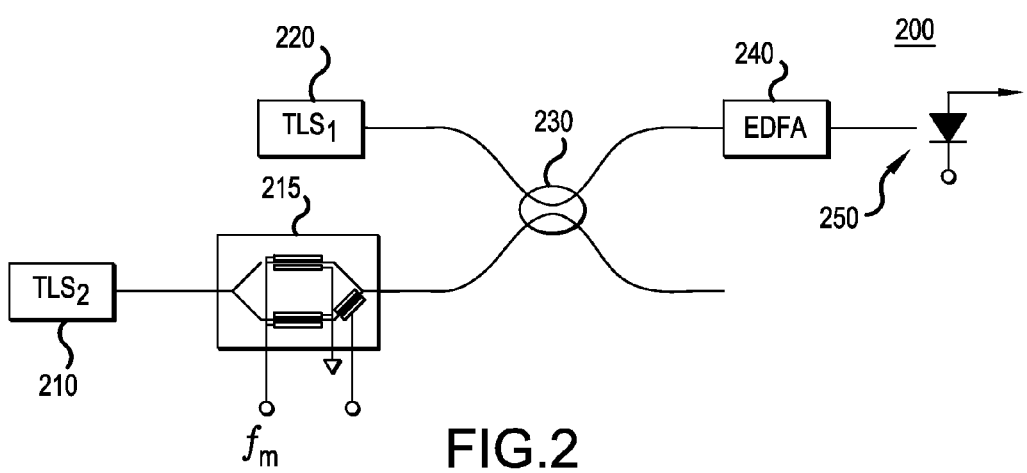
FIG. 2 illustrates an example embodiment of a signal generator which may be used in the system of FIG. 1.

FIG. 2 illustrates an example embodiment of a signal generator 200 which may be used in the system 100 of FIG. 1 to generate test signal 102 for DUT 10. Signal generator 200 includes: a first optical source, comprising a first laser 210 and a modulator 215; a second optical source comprising a second laser 220; an optical combiner 230; an optical amplifier (e.g., an Erbium Doped Fiber Amplifier (EDFA)) 240; and a square law detection device 250 (e.g., a photodetector diode). In some embodiments where the signal level output by optical combiner 230 is sufficient, optical amplifier 240 may be omitted.

In particular, signal generator 200 is an example of an apparatus which employs optical means for generating test signal 102.

This may be accomplished as follows. In operation, first laser 210 outputs a first optical signal having a first frequency, and modulator 215 modulates the first optical signal, to produce a modulated first optical signal. Beneficially, the modulated first optical signal includes at least two sidebands having corresponding sideband frequencies whose separation from the first frequency is equal to the modulation frequency of modulator 215. Modulator 215 may be a phase or intensity modulator or a more complex modulator such as a nested Mach-Zehnder modulator. A nested Mach-Zehnder modulator may produce an arbitrary spectrum. Second laser 220 outputs a second optical signal having a second frequency different from the first frequency. Optical combiner 230 combines the modulated first optical signal and the second optical signal to produce a combined modulated first optical signal and second optical signal, and (optionally) optical amplifier 240 amplifies the combined modulated first optical signal and second optical signal. Square law detection device 250 receives the combined modulated first optical signal and second optical signal, and in response thereto to produce an electrical signal which includes a carrier as a beat frequency, or heterodyne beat signal, between the first frequency and the second frequency, and which further includes at least two sidebands having corresponding sideband frequencies generated in response to the modulating of the first frequency of the first optical signal.

In signal generator 200, the first and second optical signals are at the optical frequencies $v_1$ and $v_2$. The resulting electrical heterodyne beat frequency is at the frequency difference $f_c = v_2 - v_1$. Beneficially, at least one of first laser 210 and second laser 220 is tunable in frequency to allow tunability of the resulting beat frequency. For example, the second optical source including second laser 220 may be configured to tune the frequency of the second optical signal so that DUT may be characterized at several different frequencies, for example across a range of frequencies. Such frequency tuning may be continuous or stepped. In addition, the first optical output signal of first laser 210 is modulated in phase or in amplitude at the modulation frequency $f_m$. The modulation produces sidebands, two of which are at the optical frequencies $v_2 \pm f_m$. After mixing at square law detection device 250, the optical frequencies of the sidebands are mapped onto electrical sideband frequencies $f_c \pm f_m$ on both sides of the carrier frequency, $f_c$ (the modulation frequency $f_m$ is less than the carrier frequency, $f_c$.) Since at optical frequencies of about 200 THz a change in frequency of about 100 GHz is very small, the properties of the generated carrier and sidebands are nearly the same over a wide frequency range, e.g.: over 100 GHz. This would be difficult to accomplish by modulation of an electrical signal.

The use of signal generator 200 in system 100 is not essential. However, in some embodiments signal generator 200 allows very wide tune-ability of the electrical frequency that can easily reach a range of 100 GHz. Ideally, the produced electrical frequency is very stable. This high stability results in a very narrow spectral linewidth (e.g., 10 Hz). However, in some embodiments signal generator 200 may produce test signal 102 with a broader linewidth (e.g., 10 kHz or larger) that exercises the robustness of the measurement technique employed by system 100.

FIG. 3 illustrates the time waveform 300 of an example signal which may be generated by the example embodiment of a signal generator of FIG. 2, and FIG. 4 illustrates the frequency spectrum 400 of an example signal which may be generated by the example embodiment of a signal generator of FIG. 2. The carrier frequency $f_c$ and the two sideband frequencies $f_c \pm f_m$ are clearly seen in FIG. 4.

Figure 5:
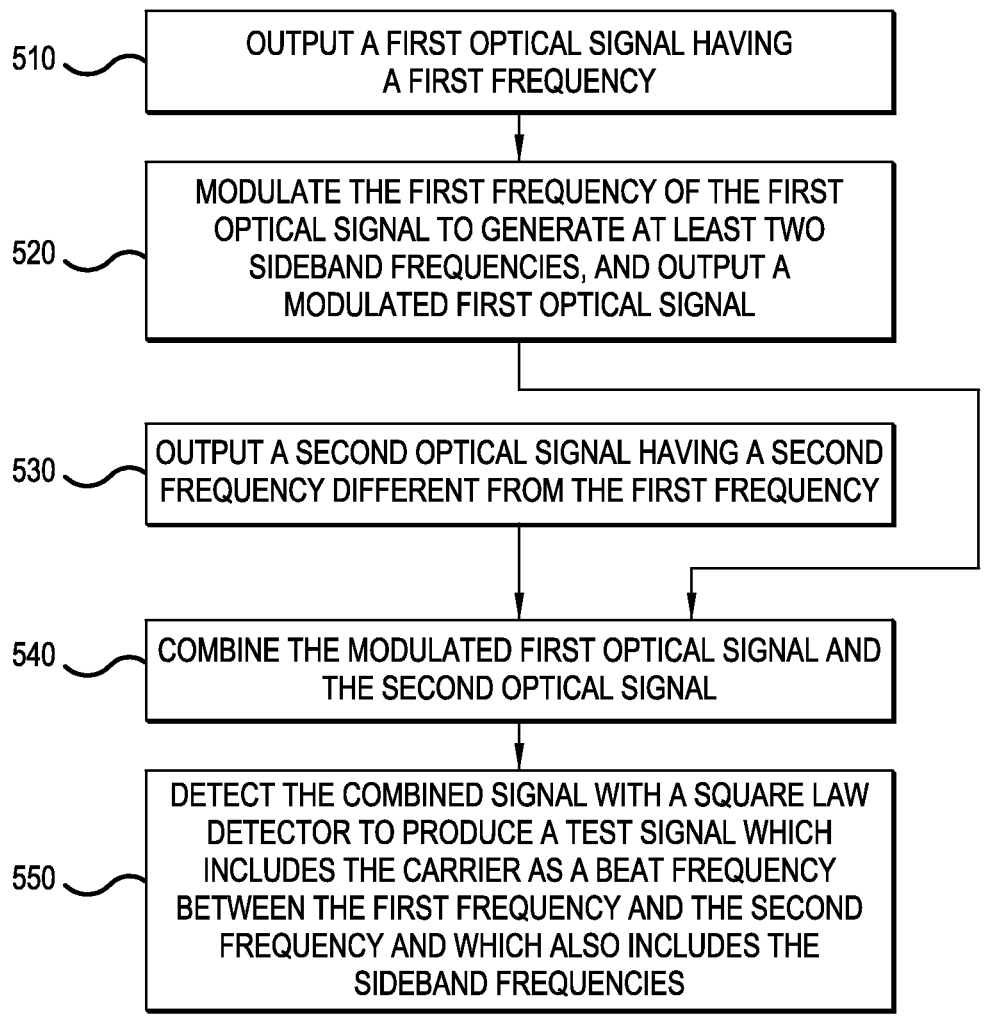
FIG. 5 is a flowchart of an example embodiment of a method of generating a test signal which may be used in the system of FIG. 1.

FIG. 5 is a flowchart of an example embodiment of a method 500 of generating a test signal such as test signal 102 which may be used in the system of FIG. 1.

Method 500 includes: an operation 510 of outputting a first optical signal having a first frequency; an operation 520 of modulating the first frequency of the first optical signal to generate at least two sideband frequencies, and outputting a modulated first optical signal; an operation 530 of outputting a second optical signal having a second frequency different from the first frequency; an operation 540 of combining the modulated first optical signal and the second optical signal; and an operation 550 of detecting the combined modulated first optical signal and second optical signal with a square law detector to produce the test signal which includes a carrier as a beat frequency between the first frequency and the second frequency and which further includes the at least two sideband frequencies.

Turning now back to FIG. 1, test signal 102 containing a carrier frequency and at least two sidebands is provided to device under test (DUT) 10.

In the discussion to follow, issues of coupler calibration are omitted for simplicity, and it is assumed that the couplers are identical and ideal. Furthermore, for simplification, it is assumed that only the forward path from port 1 to port 2 is tested for the S-parameters S11 and S21, and therefore switch 130 and couplers 160 and 170 may be eliminated, and the output of variable attenuator 120 may be provided directly to coupler 140, and the output of from port 2 of DUT 10 may be connected directly to the properly matched input of signal processor 180 as test port D.

With signal generator 200 being employed for signal generator 110 in system 100, the spectra of the signals at the test system ports of system 100 may include a carrier frequency with at least two sidebands, and in some cases a modulation frequency. The modulation frequency is present if signal generation includes intensity modulation, as discussed above with respect to signal generator 200.

Figure 6:
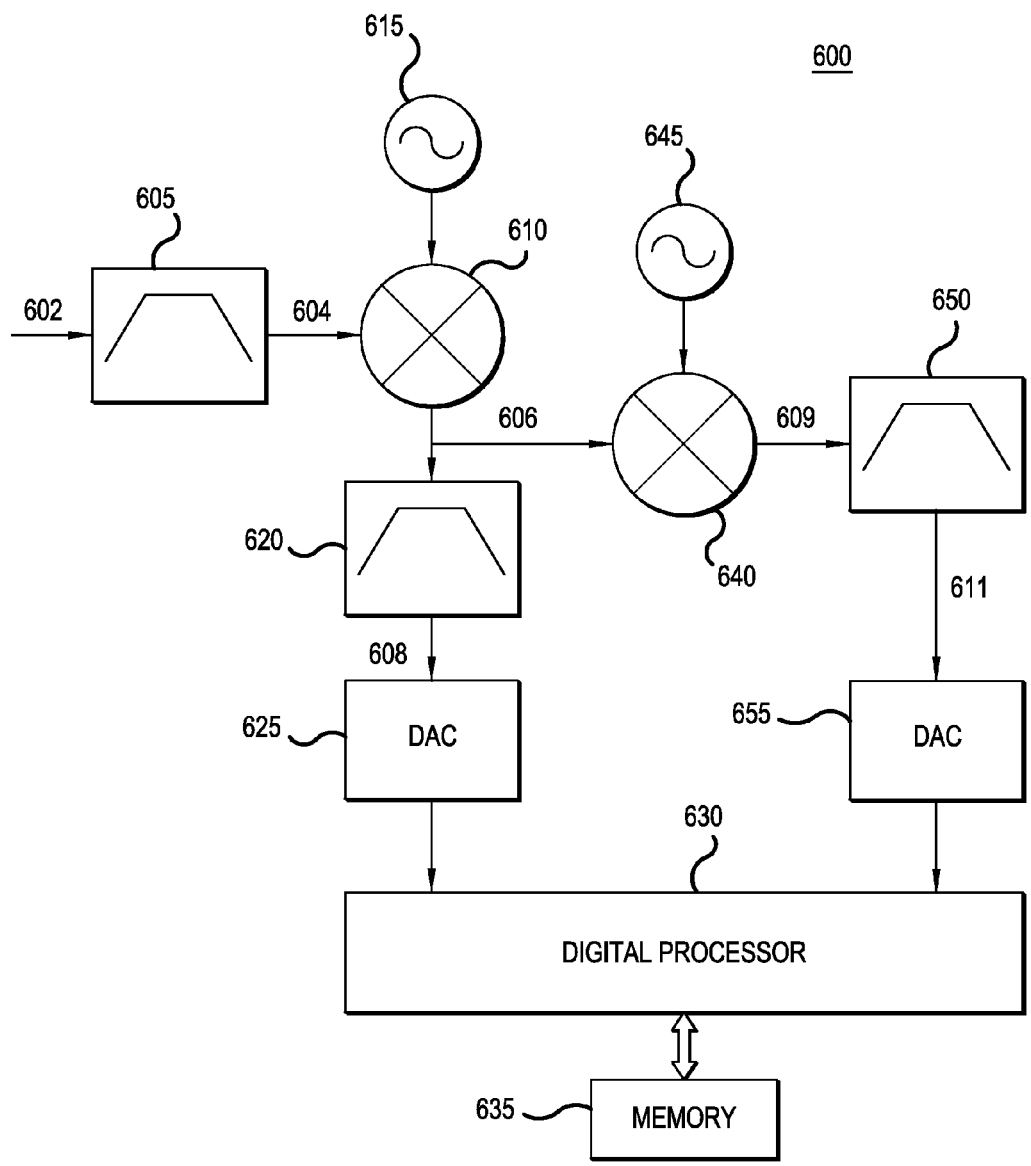
FIG. 6 illustrates an example embodiment of a signal processing apparatus which may be used in the system of FIG. 1.

FIG. 6 illustrates an example embodiment of a signal processing apparatus 600 which may be used in the system of FIG. 1. In particular, signal processing apparatus 600 may be part of signal processor 180 in FIG. 1. In some embodiments, signal processor 180 may include a plurality of signal processing apparatuses 600, one for each channel or test port whose signal is to be processed by signal processor 600 to obtain S-parameters and/or dispersions. In that case, the input signal 602 for each signal processing apparatus 600 may be produced, for example, from any one of the sensed incident signal, the sensed reflected signal, or the sensed transmitted signal for DUT 10.

Signal processing apparatus 600 includes: a first mixing stage comprising a first filter 605 (e.g., a first bandpass filter), a first mixer 610, a first signal generator 615 (e.g., an oscillator or programmable frequency generator), and a second filter 620 (e.g., a first lowpass filter); a first digital-to-analog converter (DAC) 625; a digital processor 630 and associated memory 635; a second mixing stage comprising a second mixer 640, a second signal generator 645 (e.g., an oscillator or programmable frequency generator), and a third filter 650 (e.g., a second lowpass filter); and a second DAC 655. Memory 635 may include any combination of static and dynamic memory elements, including for example dynamic random access memory (DRAM), static random access memory (SRAM), read only memory (ROM), electrically erasable programmable ROM (EEPROM), FLASH memory, etc. In some embodiments, digital processor 630 includes a microprocessor configured to execute instructions stored in memory 635 to execute one or more routines or algorithms as described below, for example to implement a Hilbert transform, to implement a Kalman filter, etc.

It should be understood that processing apparatus 600 is one exemplary embodiment, and that variations and other configurations are possible which achieve the signal processing objectives of signal processor 180 as described in greater detail below.

As but one example, in some embodiments digitization may be performed on the input signal 602, in which case all of the filtering and mixing operations represented in FIG. 6 by elements 605, 610, 620, 640, 650, etc. are performed digitally by a digital processor such as digital processor 630 with associated memory 635. With this understanding in mind, an explanation of an example operation of signal processor 180 of FIG. 1 will now be provided with respect to the example embodiment signal processor 600 to provide a more concrete explanation of the operation.

An example operation of signal processing apparatus 600 in the context of signal processor 180 of FIG. 1 will now be provided. In that context, the input signal 602 for each signal processing apparatus 600 may be produced, for example, from any one of the sensed incident signal, the sensed reflected signal, or the sensed transmitted signal for DUT 10.

There are many ways to implement signal processing that yields S-parameters and dispersion. The methods described below are just examples. In these described methods, S-parameters are estimated from the carrier frequency of test signal 102 ($f_c$ in FIG. 4), while dispersion is estimated from the sidebands ($f_c \pm f_m$ in FIG. 4). It is important to note that estimation of dispersion from relative amplitudes and phases of sidebands is immune to the phase and amplitude noise. The S-parameters are estimated from the ratio of two complex quantities measured at different test ports (e.g., test ports A and B).

Figure 7:
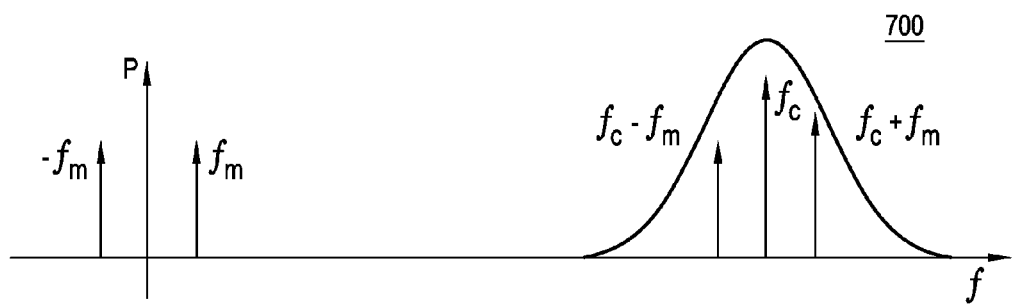
FIG. 7 illustrates the frequency spectrum of an example of a signal obtained from the DUT after processing by the example embodiment system shown of FIG. 1.
Figure 8:
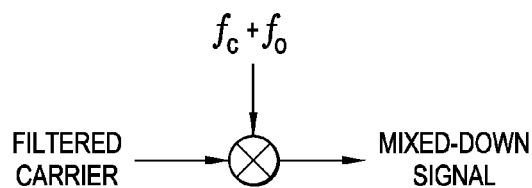
FIG. 8 illustrates an arrangement which may be employed in an example of the signal processing apparatus of FIG. 6 in the example embodiment system of FIG. 1.
Figure 9:
FIG. 9 illustrates the frequency spectrum of the signal whose frequency spectrum is shown in FIG. 7, after additional processing illustrated in FIG. 6 and applicable to the example embodiment system shown in FIG. 1.

We start by considering the sensed incident signal at test port A as the input signal 602 for signal processing apparatus 600. Input signal 602 is filtered by first filter 605, e.g., a first bandpass filter centered at or near $f_c$ as illustrated in FIG. 7 to produce a filtered signal 604 including the bandpass filtered carrier. Then, as illustrated in FIG. 8, the carrier frequency $f_c$ is mixed down by first mixer 610 with a signal produced by first signal generator 615 (e.g. an oscillator at frequency $f_c + f_o$) to some offset frequency $f_o$ that is less than the modulation frequency $f_m$, producing an output signal 606 having a spectrum such as that shown in FIG. 9.

Figure 10:
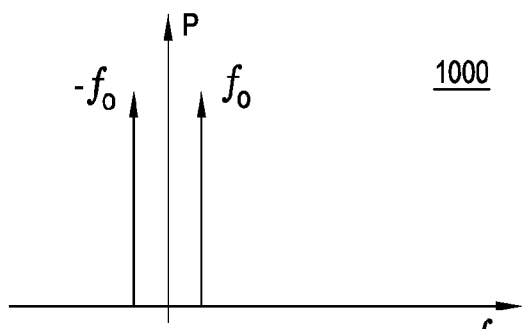
FIG. 10 illustrates the filtered frequency spectrum of the signal whose frequency spectrum is shown in FIG. 9, after additional processing illustrated in FIG. 6 and applicable to the example embodiment system shown in FIG. 1.

After appropriate filtering (e.g., lowpass filtering) with second filter 620, this yields an approximately sinusoidal signal 608 at offset frequency $f_o$ having an example spectrum as shown in FIG. 10.

Figure 11:
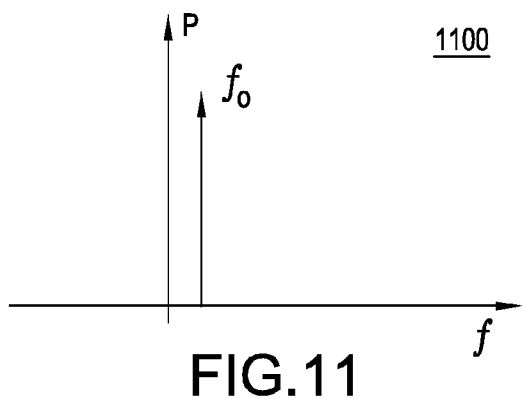
FIG. 11 illustrates the filtered frequency spectrum of the signal whose frequency spectrum is shown in FIG. 10, after additional processing illustrated in FIG. 6 and applicable to the example embodiment system shown in FIG. 1.
Figure 12:
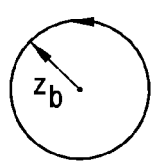
FIG. 12 illustrates a relationship between the phasors of processed signals illustrated in FIG. 11 and obtained from different ports of a test system to determine an S-parameter of a DUT.
Figure 12:
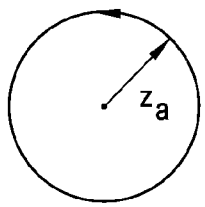

The signal 608 can be digitized by DAC 625 and converted into a complex signal having a spectrum as illustrated in FIG. 11, for example by means of a Hilbert transform performed on the digitized signal by digital processor 630. A phasor $z_x$ that describes this complex signal at a given port x traces nearly a circular trajectory in a complex plane. The phasors measured at different test ports (e.g., at test port A and test port B) are related by S-parameters. For example, as illustrated in FIG. 12, S21 acts as a complex multiplier which relates the phasors $z_a$ and $z_b$. In this particular implementation it is perfectly allowable that the offset frequency $f_o$ is not pure but contains some phase noise as this does not affect the relationships between the phasors $z_a$ and $z_b$. Since $z_a$ and $z_b$ are vectors, the complex multiplier between them can be determined by least squares estimation from equation (1):

$$S_{21} = \frac{z_a^H z_b}{z_a^H z_a} \qquad (1)$$

where $z_a^H = z_a^{*T}$. Here it is important to note that $z_a$ is a phasor that spins counterclockwise at the approximate frequency of $f_o$, while the complex conjugate $z_a^*$ spins in an opposite (clockwise) direction. As described in greater detail below, this property may be used to decompose elliptical motion into two circular motions of opposite directions.

Thus, as described above, the sensed incident signal, the sensed reflected signal, and the sensed transmitted signal for DUT 10 may each be processed as described above with respect to FIG. 6 to obtain corresponding complex signals such as shown in FIG. 11, and the S-parameters then can be obtained based on relationships between the phasors that describe these complex signals, using equations similar Equation (1) above.

Next it will be explained how dispersion can be measured with signal processor 180, particularly with respect to signal processing apparatus 600. Here, an additional mixing step is employed to measure dispersion from the sideband frequencies (see. FIG. 4)

Figure 13:
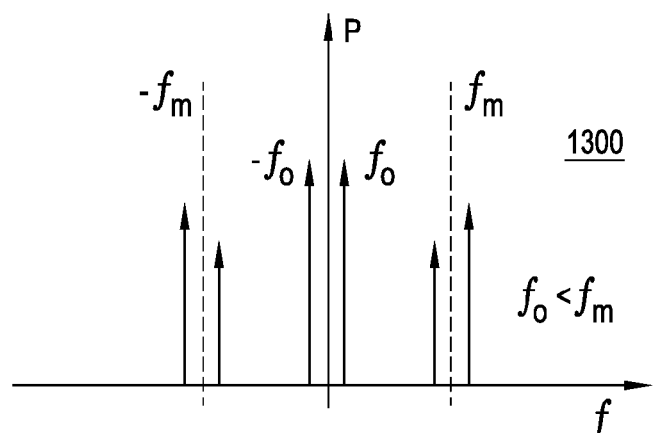
FIG. 13 illustrates in more detail the frequency spectrum of the signal whose frequency spectrum is shown in FIG. 9, prior to filtering.

As shown in FIG. 13, which shows an example spectrum of signal 606, after mixing is performed by first mixer 610, the sidebands of signal 606 are located symmetrically on both sides of the modulation frequency, $f_m$.

Figure 14:
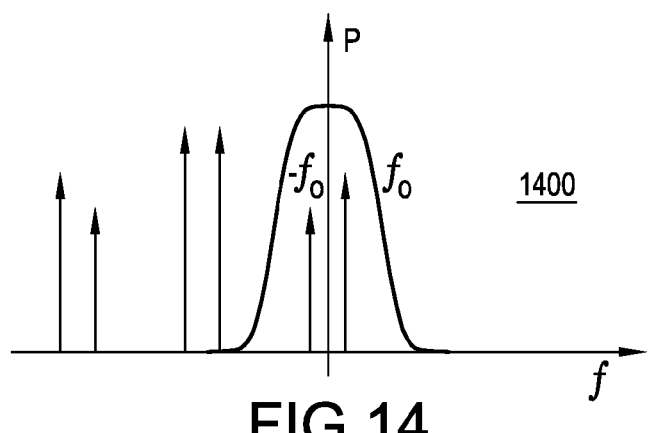
FIG. 14 illustrates the frequency spectrum of the signal whose frequency spectrum is shown in FIG. 13, after additional processing illustrated in FIG. 6 and applicable to the example embodiment system shown in FIG. 1.
Figure 15:
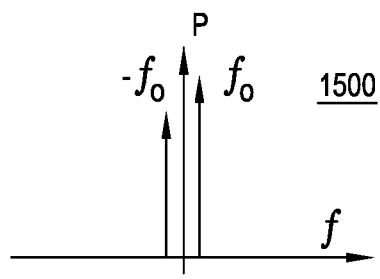
FIG. 15 illustrates the filtered frequency spectrum of the signal whose frequency spectrum is shown in FIG. 14, after additional processing illustrated in FIG. 6 and applicable to the example embodiment system shown in FIG. 1.

As shown in FIG. 6, signal 606 is input into second mixer 640 and subjected to a second mixing operation with a signal produced by second signal generator 645 (e.g. an oscillator at frequency $f_m$) which produces a signal 609 where the modulation sidebands are mixed down to be centered at DC and symmetrically located around zero frequency, as shown in the example spectrum of FIG. 14. The second mixer 640 is an image rejection mixer. After passing signal 609 through third filter 650 (e.g., a lowpass filter), a signal 611 having an example spectrum as shown in FIG. 15 is obtained.

Figure 16:
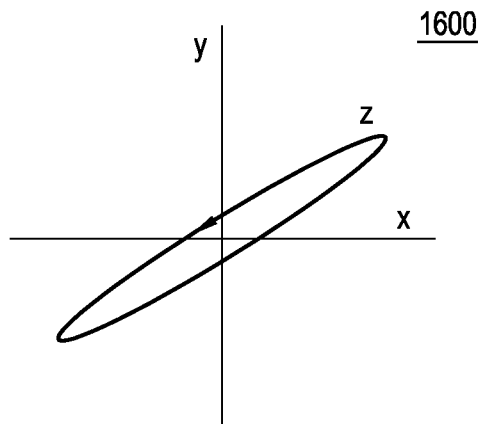
FIG. 16 illustrates a time plot in the complex plane of the signal whose frequency spectrum is shown in FIG. 15.

Two symmetrically located frequency components are represented by two phasors that spin in opposite directions at an exactly the same frequency. It can be shown that in time this results in an ellipse that is traced in a complex plane, as illustrated in FIG. 16. The angular position of this ellipse describes or indicates the group delay (the phase difference between the sidebands), while the ellipticity is related to and indicates the amplitude slope (the amplitude difference between the sidebands). The position and shape of the ellipse does not depend on the phase noise (frequency fluctuations) or the amplitude noise. Frequency fluctuation results in faster or slower spinning on the elliptical trajectory, however, the trajectory itself does not change. Changes in amplitude may change the size of the ellipse, but its rotational position and shape remain the same.

By processing the sampled signal at each of the test ports of system 100 as described above with respect to signal processing apparatus 600, dispersions can be measured at each of the test ports. The dispersion that corresponds to a particular S-parameter can be found from the difference between the dispersions at two different ports. For example, the dispersion of $S_{21}(\omega)$, which is defined here as $D_{21}(\omega)$, is a difference between the dispersion at test port B and the dispersion at test port A according to equation (2):

$$D_{21}(\omega) = D_b(\omega) - D_a(\omega) \quad (2)$$

Figure 17:
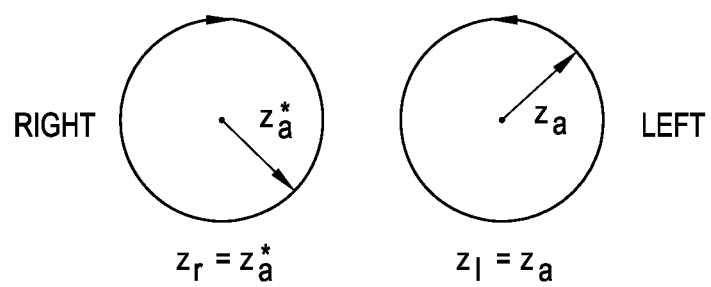
FIG. 17 illustrates a left circular component and a right circular component that are constructed from a signal of FIG. 12 and used for decomposition of the time signal of FIG. 16.

There are many ways to measure the angular position and shape of the ellipse illustrated in FIG. 16. One way is to decompose the motion on the elliptical trajectory, z, into the left circular and the right circular motion described by the complex variables $z_l = z_a$ and $z_r = z^*_a$. The complex variables $z_l$ and $z_r$ representing the left circular component and the right circular component used for decomposing the time signal of FIG. 16 are illustrated in FIG. 17. The complex variable $z_a$, also shown in FIG. 12, is found during estimation of the S-parameters as described above. This formulation has the least squares solution that determines the content of left circular and right circular motion according to the formulas of equation 3:

$$c_l = \frac{z_l^H z}{z_l^H z_l} \text{ and } c_r = \frac{z_r^H z}{z_r^H z_r} \quad (3)$$

Constants $c_l$ and $C_r$ are complex. Constant $c_l$ represents the counterclockwise spinning phasor that originated from the right sideband at the initial frequency $\omega_c + \omega_m$, and constant $c_r$ represents the clockwise spinning phasor that originated from the left sideband at the initial frequency $\omega_c - \omega_m$. In exponential notation, constants $C_l$ and $C_r$ can be expressed by equation 4:

$$c_l = a \exp(\alpha(\omega_c + \omega_m) + j\theta(\omega_c + \omega_m))$$

$$c_r = a \exp(\alpha(\omega_c - \omega_m) - j\theta(\omega_c - \omega_m)) \quad (4)$$

where a is some unknown multiplier, $\alpha$ is the attenuation, and $\theta$ is the phase. The phase sign change in the second equation is due to mixing that mapped the original left sideband onto negative frequencies (and negative phase). Dispersion can be found from equation (5):

$$D = j \ln\left(\frac{c_l}{c_r^*}\right) \frac{1}{2\omega_m} \quad (5)$$

The above formula becomes clear after substitution of (4) into (5), yielding equation (6):

$$D = -\frac{\theta(\omega_c + \omega_m) - \theta(\omega_c - \omega_m)}{2\omega_m} + j\frac{\alpha(\omega_c + \omega_m) - \alpha(\omega_c - \omega_m)}{2\omega_m} \quad (6)$$

Clearly, equation (6) represents approximated derivatives of phase and attenuation that constitute the definition of dispersion.

An explanation will now be provided as to how to merge S-parameters and dispersions into recursive equations that are suitable for implementation via a Kalman filter.

When working with the S-parameters and dispersion it is very convenient to rewrite the S-parameter in exponential notation as in equation (7):

$$S(\omega) = \exp(\alpha(\omega) + j\theta(\omega)) \quad (7)$$

where $\alpha(\omega)$ describes the amplitude on the logarithmic scale (sometimes referred to as attenuation), and $\theta(\omega)$ describes the phase. The dispersion is defined by equation (8):

$$D(\omega) = j\frac{S(\omega)}{d\omega}\frac{1}{S(\omega)} \quad (8)$$

This yields equation (9):

$$D(\omega) = -\frac{d\theta(\omega)}{d\omega} + j\frac{d\alpha(\omega)}{d\omega} = \tau + jq \quad (9)$$

The derivative of phase is the well-known group delay, $\tau$, while the derivative of amplitude (attenuation) is the amplitude slope (attenuation slope), q. Since the S-parameters are ratios of two complex functions, it is also convenient to describe those functions in the exponential form. For example, $S_{21}(\omega)$ is the ratio of the wave transmitted through DUT 10, $B(\omega)$, to the incident wave, $A(\omega)$. Thus, equation (10):

$$S(\omega) = \frac{B(\omega)}{A(\omega)} = \quad (10)$$

-continued $$\frac{\exp(\alpha_b(\omega) + j\theta_b(\omega))}{\exp(\alpha_a(\omega) + j\theta_a(\omega))} = \exp((\alpha_b(\omega) - \alpha_a(\omega)) + j(\theta_b(\omega) - \theta_a(\omega)))$$

Based on definitions in equations (8) and (10), the dispersion can be expressed according to equation (11):

$$D(\omega) = -\frac{d(\theta_b(\omega) - \theta_a(\omega))}{d\omega} + j\frac{d(\alpha_b(\omega) - \alpha_a(\omega))}{d\omega} = D_b(\omega) - D_a(\omega) \quad (11)$$

Thus, dispersion of a particular S-parameter is a difference between the dispersions at the test ports that are used to measure this S-parameter.

Accordingly, if we suppose that we know an S-parameter and its dispersion at some Frequency $\omega$, then, it is possible to make a prediction about that same S-parameter at a new frequency $\omega+\Delta\omega$ by assuming that the attenuation and phase changed by $\Delta\alpha$ and $\Delta\theta$, by equation (12):

$$S(\omega+\Delta\omega) = S(\omega)\exp(\Delta\alpha(\omega) + j\Delta\theta(\omega)) \quad (12)$$

However, according to equation (13):

$$\Delta\alpha(\omega) = \frac{d\alpha(\omega)}{d\omega}\Delta\omega \text{ and } \Delta\theta(\omega) = \frac{d\theta(\omega)}{d\omega}\Delta\omega \quad (13)$$

Therefore, based on equations (11) and (13), equation (12) can also be expressed in terms of dispersion by equation (14):

$$S(\omega+\Delta\omega) = S(\omega)\exp(-jD(\omega)\Delta\omega) \quad (14)$$

By taking a natural logarithm of equation (14), and by indexing frequencies, equation (14) can be rewritten as equation (15):

$$\alpha_{i+1} + j\theta_{i+1} = \alpha_i + j\theta_i + q_i\Delta\omega - j\tau_i\Delta\omega \quad (15)$$

where index i denotes the frequency $\omega = i\Delta\omega$. The recursive formula for attenuation can be expressed by equation (16):

$$\alpha_{i+1} = \alpha_i + q_i\Delta\omega \quad (16)$$

The recursive formula for phase can be expressed by equation (17):

$$\theta_{i+1} = \theta_i - \tau_i\Delta\omega \quad (17)$$

The above recursive formulas allow implementation of a Kalman filter that blends S-parameters and dispersion in a way analogous to the blending position and velocity in a system which obtains positional data via the Global Positioning System (GPS) and velocity and direction data via an inertial navigation system (INS).

Figure 18:
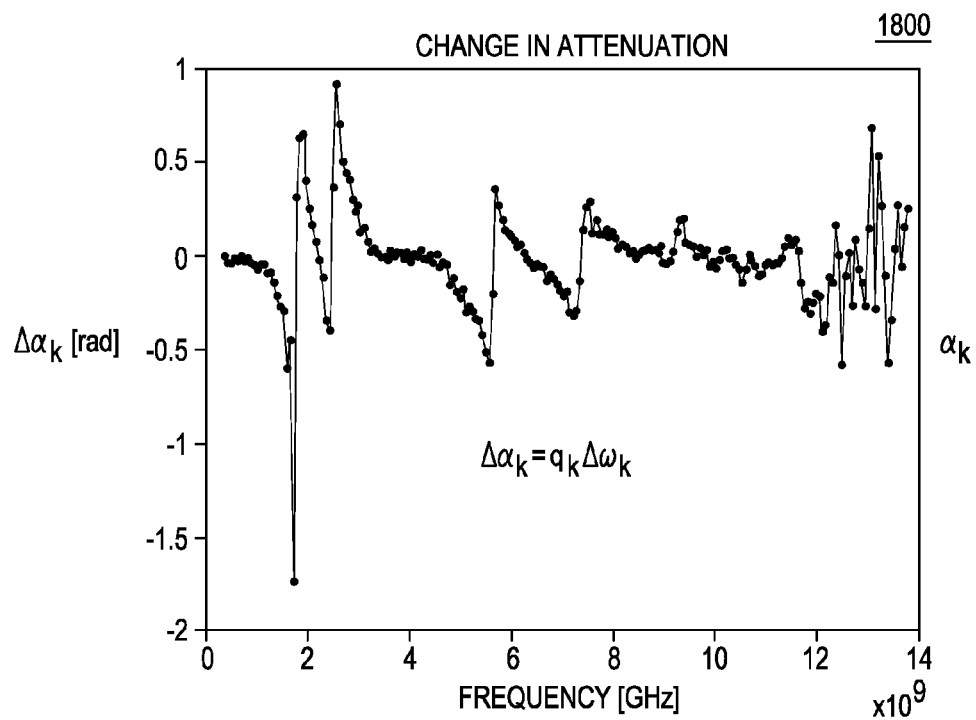
FIG. 18 plots, as a function of frequency, an estimate of a change in attenuation produced by a DUT, obtained from the measured amplitude, amplitude slope and the angular frequency step using a Kalman filter.

FIG. 18 shows a plot 1800, as a function of frequency, of an estimate of a change in attenuation produced by a DUT, obtained from the measured amplitude, amplitude slope and the angular frequency step using a Kalman filter.

Figure 19:
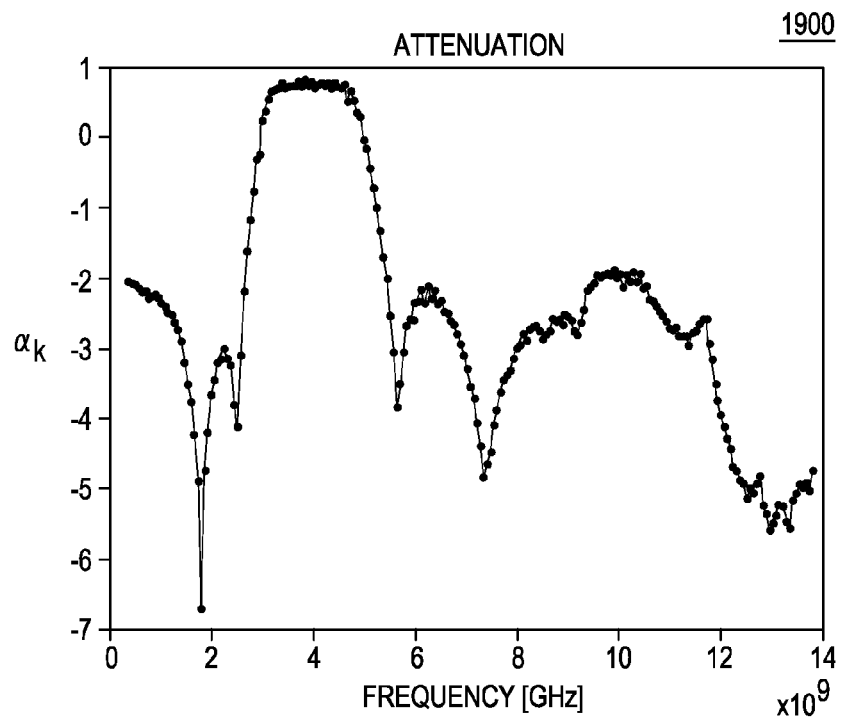
FIG. 19 plots, as a function of frequency, an estimate of the attenuation produced by a DUT using the Kalman filter which was also used to produce the estimate of the change in attenuation which is plotted in FIG. 18.

FIG. 19 shows a plot 1900, as a function of frequency, of an estimate of the attenuation produced by a DUT obtained from the measured amplitude, amplitude slope and the angular frequency step using the same Kalman filter. The state equations that control the operation of this Kalman filter are:

$$\Delta\alpha_{i+1} = \Delta\alpha_i$$

$$\alpha_{i+1} = \alpha_i + \Delta\alpha_i' \quad (18)$$

where $\Delta\alpha_i = q_i\Delta\omega$. The operation of the Kalman filter is clear to those familiar with the art.

Figure 20:
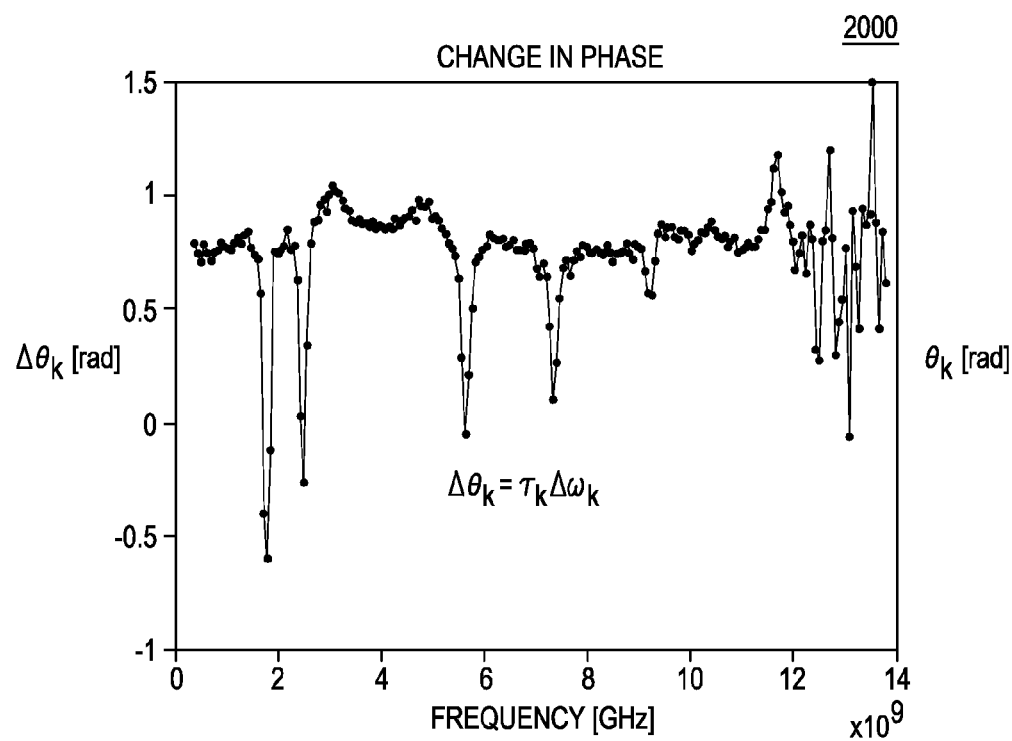
FIG. 20 plots, as a function of frequency, an estimate of a change in the phase shift produced by a DUT, obtained from the measured phase, group delay and the angular frequency step using a Kalman filter.

FIG. 20 shows a plot 2000, as a function of frequency, of an estimate of a change in the phase shift produced by a DUT, obtained from the measured phase, group delay and the angular frequency step using a Kalman filter.

Figure 21:
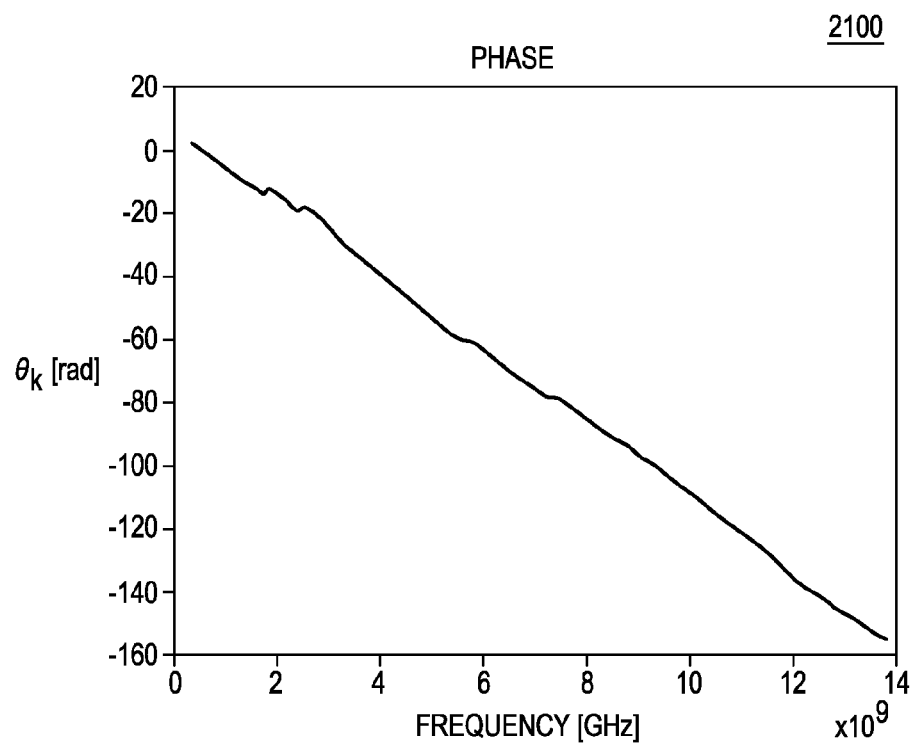
FIG. 21 plots, as a function of frequency, an estimate of the phase shift produced by a DUT using the Kalman filter which was also used to produce the estimate of the change in phase shift which is plotted in FIG. 20.

FIG. 21 shows a plot 2100, as a function of frequency, of an estimate of the phase shift produced by a DUT obtained from the measured phase, group delay and the angular frequency step using the same Kalman filter. The state equations that control the operation of this Kalman filter are:

$$\Delta\theta_{i+1} = \Delta\theta_i$$

$$\theta_{i+1} = \theta_i - \Delta\theta_i' \quad (19)$$

where $\Delta\theta_i = \tau_i\Delta\omega$. The operation of the Kalman filter is clear to those familiar with the art.

Figure 22:
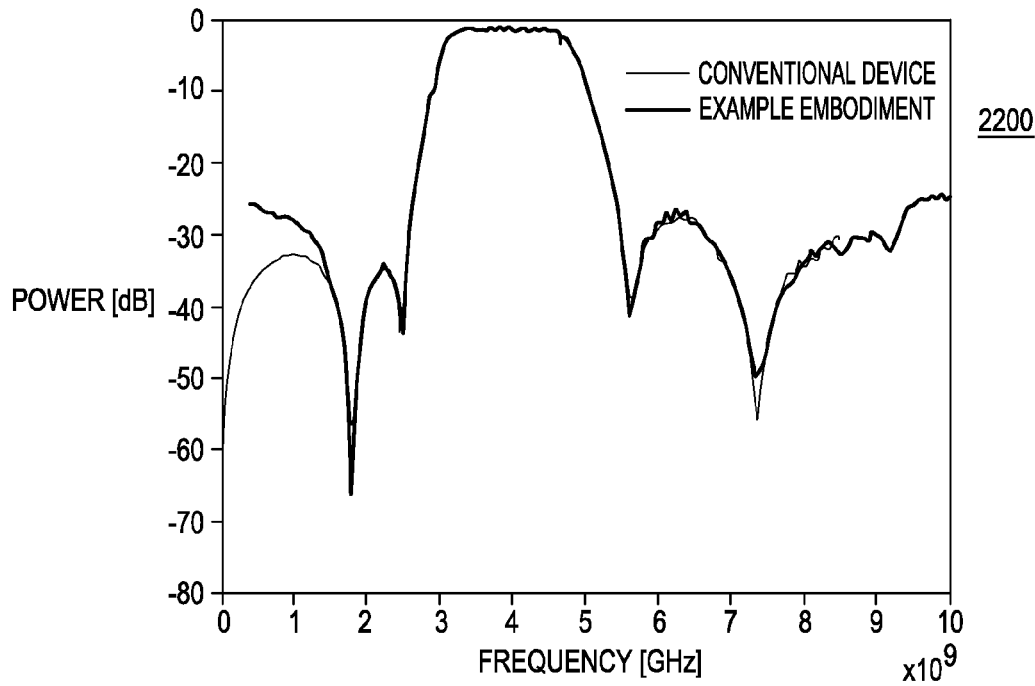
FIG. 22 compares an example S21 measurement which was produced by the system of FIG. 1 for an example DUT with a conventional S21 measurement which does not blend measurements of S-parameters and dispersion.

FIG. 22 compares an example S21 measurement which was produced by the system of FIG. 1 for an example DUT with a conventional S21 measurement which does not blend measurements of S-parameters and dispersion.

Figure 23:
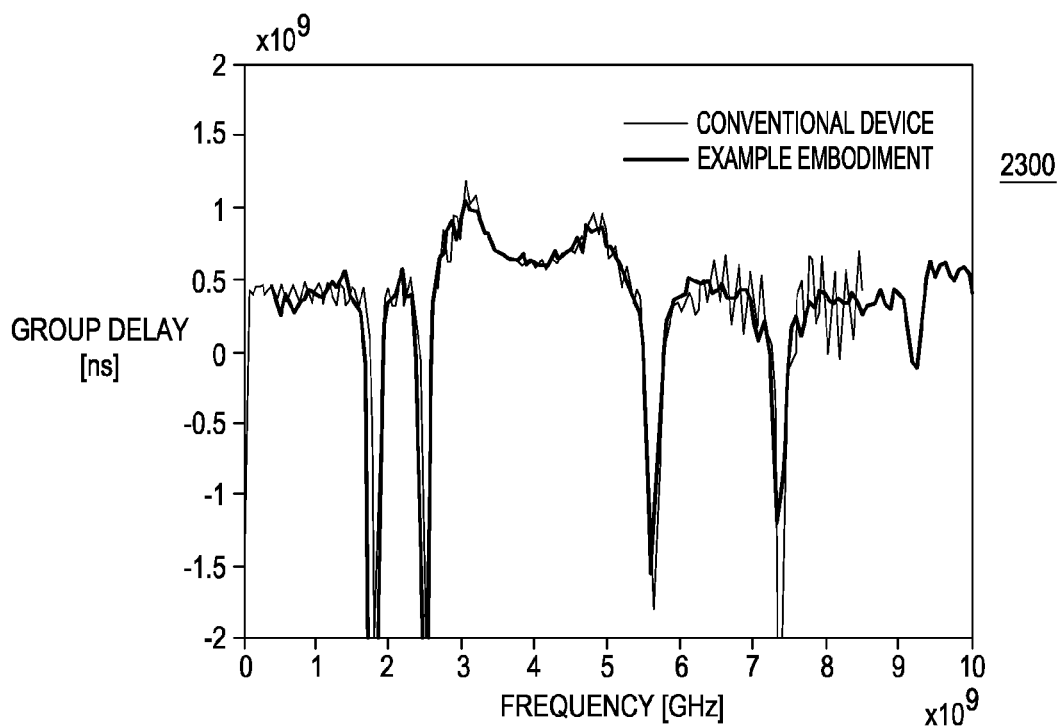
FIG. 23 compares an example group delay measurement which was produced by the system of FIG. 1 for an example DUT with a conventional group delay measurement which does not blend measurements of S-parameters and dispersion.

FIG. 23 compares an example group delay measurement which was produced by the system of FIG. 1 for an example DUT with a conventional group delay measurement which does not blend measurements of S-parameters and dispersion.

Figure 24:
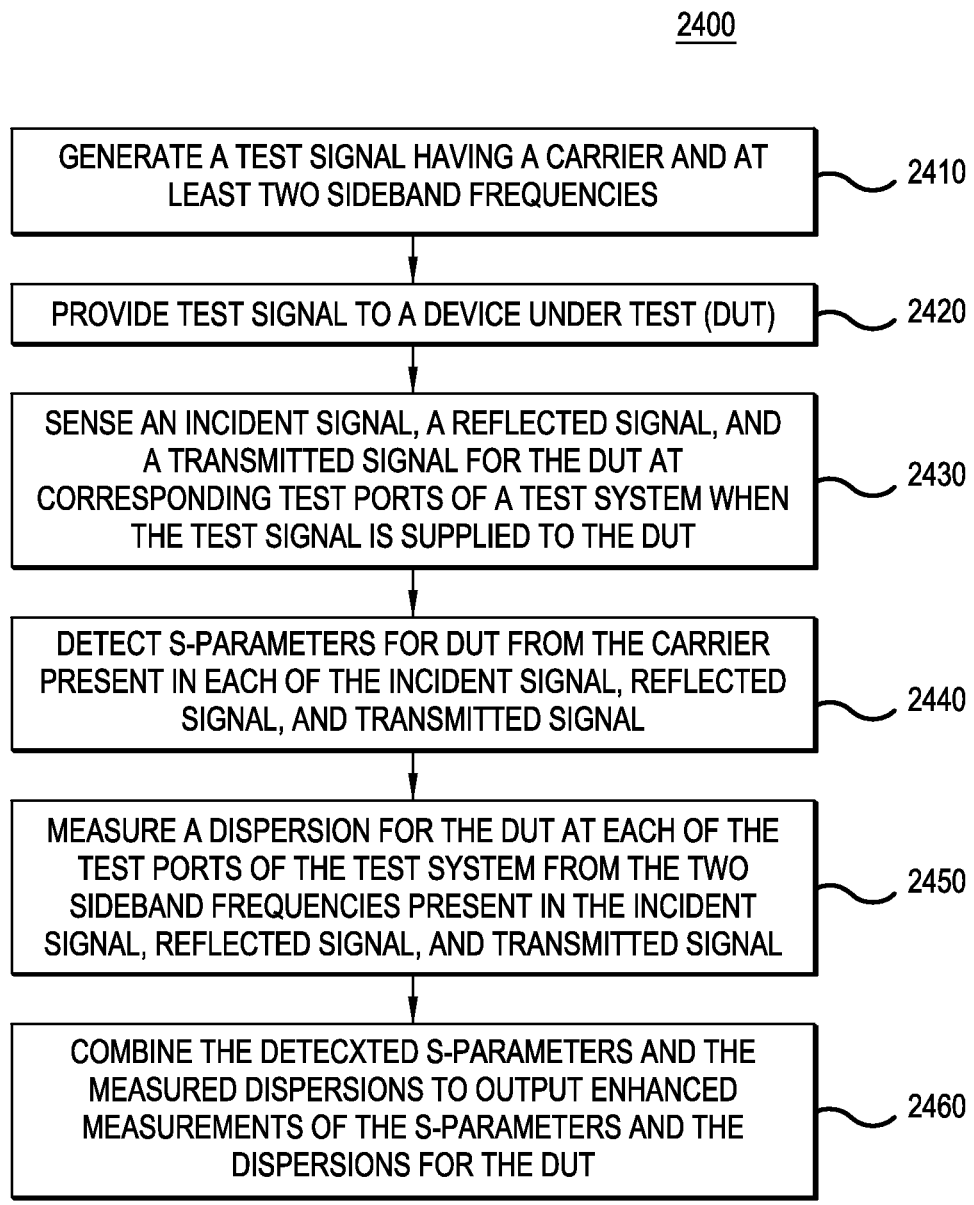
FIG. 24 illustrates an example embodiment of a method for characterizing a DUT.

FIG. 24 illustrates an example embodiment of a method 2400 for characterizing a DUT as described above.

Method 2400 includes: an operation 2410 of generating with a test signal generator a test signal having a carrier and at least two sideband frequencies; an operation 2420 of providing the test signal to a device under test; an operation 2430 of sensing an incident signal, a reflected signal, and a transmitted signal for the device under test at corresponding test ports of a test system when the test signal is supplied to the device under test; an operation 2440 of detecting S-parameters for the device under test from the carrier present in each of the incident signal, reflected signal, and transmitted signal for the device under test; an operation 2450 of measuring a dispersion for the device under test at each of the test ports of the test system from the two sideband frequencies present in the incident signal, reflected signal, and transmitted signal for the device under test; and an operation 2460 of combining the detected S-parameters and the measured dispersions to output enhanced measurements of the S-parameters and the dispersions.

While example embodiments are disclosed herein, one of ordinary skill in the art appreciates that many variations that are in accordance with the present teachings are possible and remain within the scope of the appended claims. For example, in embodiments described above the S-parameters are determined using the carrier. However in other embodiments, the carrier may be suppressed and one of the sidebands is used to detect S-parameters. The invention therefore is not to be restricted except within the scope of the appended claims.

The invention claimed is:
1. A system, comprising:
 a test signal generator configured to generate a test signal having a carrier and at least two sidebands having corresponding sideband frequencies and to provide the test signal to a device under test;
 a plurality of couplers for sensing an incident signal, a reflected signal, and a transmitted signal for the device under test at corresponding test ports of the system when the test signal is supplied to the device under test;

a signal processing apparatus configured:
  to detect S-parameters for the device under test from a carrier present in each of the incident signal, reflected signal, and transmitted signal for the device under test;
  to measure a dispersion for the device under test at each of the test ports from the two sidebands present in the incident signal, reflected signal, and transmitted signal for the device under test; and
  to combine the detected S-parameters and the measured dispersions to output enhanced measurements of the S-parameters and the dispersions.

2. The apparatus of claim 1, wherein the signal processing apparatus is configured to combine the detected S-parameters and measured dispersions using a Kalman filter.

3. The apparatus of claim 1, wherein the test signal generator comprises:
  a first optical source configured to output a first optical signal having a first frequency, wherein the first optical source is further configured for modulating the first optical signal to produce a modulated first optical signal;
  a second optical source configured to output a second optical signal having a second frequency different from the first frequency;
  an optical combiner configured to combine the modulated first optical signal and second optical signal; and
  a square law detection device configured to receive the combined modulated first optical signal and second optical signal and in response thereto to produce an electrical signal which includes the carrier as a beat frequency between the first frequency and the second frequency,
  wherein the test signal is produced from the electrical signal.

4. The apparatus of claim 3, wherein the second optical source is configured to tune the frequency of the second optical signal.

5. The apparatus of claim 4, wherein the tuning of the frequency is continuous or stepped.

6. The apparatus of claim 3, wherein the first optical source is configured for modulating the first optical signal at a modulation frequency to produce the at least two sidebands whose separation from the first frequency is equal to the modulation frequency.

7. The apparatus of claim 3, wherein the electrical signal further includes the at least two sidebands, wherein the two sidebands are produced in the electrical signal from the modulated first optical signal.

8. The apparatus of claim 1, wherein the carrier is suppressed and one of the sidebands is used to detect S-parameters.

9. The apparatus of claim 1, wherein the signal processing apparatus includes a first mixing stage configured to process each of the incident signal, a reflected signal, and a transmitted signal for the device under test, the first mixing stage including:
  a first bandpass filter configured to filter the signal to pass at least the carrier;
  a first mixer connected to receive an output of the first bandpass filter and further configured to mix the carrier down to an offset frequency which is less than a modulation frequency of the test signal generator; and
  a first lowpass filter configured to filter an output signal of the mixer to pass the carrier at the offset frequency and to reject the sidebands.

10. The apparatus of claim 9, wherein the signal processing apparatus is further configured to produce a complex signal.

11. The apparatus of claim 10, wherein the complex signal is produced by a Hilbert transform.

12. The apparatus of claim 10, wherein the signal processing apparatus is further configured to detect the S-parameters for the device under test from a least squares estimation of a complex multiplier that relates the complex signals at the different test ports of the system.

13. The apparatus of claim 9, wherein the signal processing apparatus includes a second mixing stage configured to process the output signal of the first mixer for each of the incident signal, reflected signal, and transmitted signal for the device under test, the second mixing stage including:
  a second mixer configured to mix the output signal of the first mixer such that the two sidebands are mixed down to be centered at DC and symmetrically located around zero frequency; and
  a second lowpass filter connected to receive an output of the second mixer and further configured to pass the two sidebands symmetrically located around zero frequency.

14. The apparatus of claim 13, wherein the two sidebands trace an ellipse in the complex plane, and wherein the signal processing apparatus is further configured to determine the dispersion from an angular position and ellipticity of the ellipse, wherein the angular position indicates a group delay and the ellipticity indicates an amplitude slope.

15. The apparatus of claim 14, wherein the signal processing apparatus is further configured to measure the angular position and ellipticity of the ellipse by decomposing motion on the ellipse into a left circular component and a right circular component.

16. A method, comprising:
  generating with a test signal generator a test signal having a carrier and at least two sidebands having corresponding sideband frequencies;
  providing the test signal to a device under test;
  sensing an incident signal, a reflected signal, and a transmitted signal for the device under test at corresponding test ports of a test system when the test signal is supplied to the device under test;
  detecting S-parameters for the device under test from the carrier present in each of the incident signal, reflected signal, and transmitted signal for the device under test;
  measuring a dispersion for the device under test at each of the test ports of the test system from the two sidebands present in the incident signal, reflected signal, and transmitted signal for the device under test; and
  combining the detected S-parameters and the measured dispersions to output enhanced measurements of the S-parameters and the dispersions.

17. The method of claim 16, wherein the detected S-parameters and measured dispersions are combined under control of a Kalman filter.

18. The method of claim 16, wherein generating the test signal comprises:
  outputting a first optical signal having a first frequency;
  outputting a second optical signal having a second frequency different from the first frequency;
  combining the first optical signal and second optical signal; and
  detecting the combined first and second optical signals with a square law detector to produce an electrical signal which includes the carrier as a beat frequency between the first frequency and the second frequency.

19. The method of claim 18, the method further including modulating the first optical signal to generate the two sidebands in the electrical signal.

20. The method of claim 16, the method further comprising processing each of the incident signal, reflected signal, and transmitted signal for the device under test by:
bandpass filtering the signal to pass at least the carrier;
performing a first mixing of the bandpass filtered carrier down to an offset frequency which is less than a modulation frequency which is a difference between each of the sideband frequencies and the carrier; and
lowpass filtering an output signal of the first mixing to pass the carrier at the offset frequency and to reject the sidebands.

21. The method of claim 16, further comprising estimation of a complex signal.

22. The method of claim 21, further comprising performing a Hilbert transform in the estimation of the complex signal.

23. The method of claim 21, further comprising detecting the S-parameters for the device under test from a least squares estimation of a complex multiplier that relates the complex signals at the different test ports of the system.

24. The method of claim 20, further comprising:
performing a second mixing on output signal of the first mixing such that the sideband frequencies are centered at DC; and
lowpass filtering the two sideband frequencies such that they are symmetrically located around zero frequency.

25. The method of claim 24, wherein the two sideband frequencies trace an ellipse in the complex plane, the method further including determining the dispersion from an angular position and ellipticity of the ellipse, wherein the angular position indicates a group delay and the ellipticity indicates an amplitude slope.

26. The method of claim 25, further comprising measuring the angular position and ellipticity of the ellipse by decomposing motion on the ellipse into a left circular component and a right circular component.

* * * * *